United States Patent
Lee et al.

[11] Patent Number: 6,129,091
[45] Date of Patent: *Oct. 10, 2000

[54] METHOD FOR CLEANING SILICON WAFERS WITH DEEP TRENCHES

[75] Inventors: Kuei-Ying Lee; Hun-Jan Tao; Chia-Shiung Tsai, all of Hsin-Chu, Taiwan

[73] Assignee: Taiwan Semiconductor Manfacturing Company, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/725,804

[22] Filed: Oct. 4, 1996

[51] Int. Cl.$^7$ .................. B08B 3/08; B08B 3/12
[52] U.S. Cl. ................ 134/3; 134/2; 134/34; 134/26; 134/28; 134/29
[58] Field of Search .............. 134/2, 3, 26, 28, 134/29, 34, 1.3

[56] References Cited

U.S. PATENT DOCUMENTS

| | | | |
|---|---|---|---|
| 5,162,259 | 11/1992 | Kolar et al. | 437/192 |
| 5,183,795 | 2/1993 | Ting et al. | 437/230 |
| 5,294,241 | 3/1994 | Taylor et al. | 65/59.31 |
| 5,308,400 | 5/1994 | Chen | 134/2 |
| 5,470,393 | 11/1995 | Fukazawa | 134/3 |
| 5,645,737 | 7/1997 | Robinson et al. | 216/99 |

OTHER PUBLICATIONS

1996 Sigma Chemical Company Catalog, p. 553.
S. Wolf et al. "Silicon Processing For The VLSI Era"—vol. I, Lattice Press, Sunset Beach, CA, p. 516.

*Primary Examiner*—Terrel Morris
*Assistant Examiner*—Cheryl Juska
*Attorney, Agent, or Firm*—George O. Saile; Stephen B. Ackerman

[57] ABSTRACT

Current aqueous methods for removal of polymeric materials from the sidewalls of trenches etched into silicon wafers by reactive-ion-etching are inadequate for treating deep trenches having high aspect ratios. Spin-dry operations performed after the aqueous etching are incapable of completely removing rinse water and ionic species from these deep trenches, thereby leaving pockets of liquid. Subsequent evaporation of these pockets results in the concentration and eventual precipitation of residual ionic species creating watermarks. A two stage cleaning method is described in which the first stage dissolves the sidewall polymer and the second stage draws ionic species strongly chemisorbed onto the silicon surfaces into solution. A key feature of the method is that the wafer surface is not permitted to dry until after the final rinse.

12 Claims, 4 Drawing Sheets

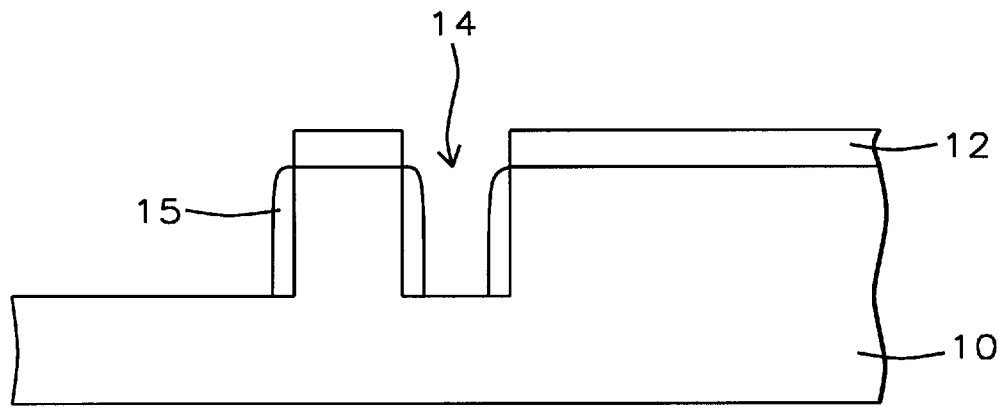
FIG. 1 - Prior Art
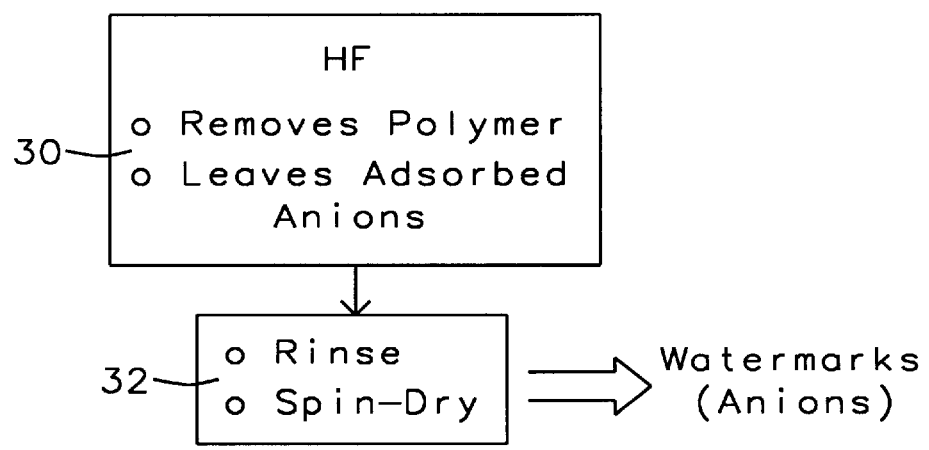
FIG. 2

6,129,091

METHOD FOR CLEANING SILICON WAFERS WITH DEEP TRENCHES

BACKGROUND OF THE INVENTION (1) Field of the Invention

The invention relates to processes for the manufacture of semiconductor devices and more particularly to processes related to the trench isolation.

(2) Description of Previous Art

The fabrication of integrated circuits involves the forming of semiconductor devices within the surface of silicon wafers. In order to insulate these devices from each other, it is necessary to provide insulative regions beneath them and laterally surrounding them. The regions which insulate these devices from each other are called device isolation. Most frequently, isolation along the base of the devices is provided by means of junction isolation whereby a p/n junction, appropriately biased, forms the insulative region.

In early technology the periphery of the device was also provided with junction isolation. Subsequently regions of silicon oxide were imbedded into the regions surrounding the device by means of localized-oxidation-of-silicon (LOCOS). The use of LOCOS in its many variations has enjoyed several decades of preferred use. In recent years, the need for reduced lateral spacing to accommodate higher densities of smaller and smaller devices has encouraged the development of trench isolation as a direct replacement of LOCOS. The devices are surrounded by narrow trenches filled with an insulator such as silicon oxide. The trenches are formed by anisotropic etching, usually reactive-ion-etching(RIE), which can create isolation regions less than one micron wide and several microns deep. As technology advances to smaller dimensions in the plane of the wafer, the aspect ratio of these trenches becomes higher. The aspect ratio is defined as the ratio of the trench depth to its width.

Referring to FIG. 1, there is shown a cross section of a silicon wafer 10 after an RIE step where deep high-aspect-ratio trenches 14 have been cut into its surface. The layer 12 represents residual masking material from the RIE operation.

It is widely agreed, that the etching anisotropy of RIE results from the formation of a protective layer 15 along the sidewalls of the trench 14 during etching. This protective layer 15 prevents lateral etching while ion bombardment at the base of the trench perpetuates the etching front. There are a number of chemistries in use for the RIE of silicon. The composition of the protective layer 15 is dependent upon the chemistry and the parametric conditions used. In common practices the layer consists of carbonaceous or silicateous polymers which remain after the etching is completed and must be removed before processing can continue. In some cases the protective layer 15 may consist of chemisorbed halogen species or even silicon oxide.

It is with the efficacious removal of these protective layer components and any other foreign residues left behind by the RIE process that this invention is concerned. Because of the topology of the trenches themselves it is difficult to cause aqueous etchants to thoroughly penetrate them and allow them to be rinsed clean.

A flow chart of a method for removal of this protective layer is shown in FIG. 2. Dissolution of the polymeric protective layer is typically accomplished by a dip in dilute hydrofluoric acid(HF) 30. Anions, probably $SiF_6^=$, its ion complex, or $HSiO_3^-$, chemisorbed on the silicon, are created by this treatment through the interaction of fluoride with exposed silicon surfaces. These species are not readily rinsed away 32 during subsequent de-ionized water rinsing procedures. Consequently, after the wafers have been subjected to the rinse/spin-dry regimen, pockets of rinse water remain in the high aspect ratio trenches, particularly in deep corners. The chemisorbed ionic species diffuse into the water pockets and concentrate as the pockets evaporate. Finally, precipitation takes place resulting in residue regions akin to watermarks.

To illustrate this the reader is referred to FIG. 3 where there is shown a cross section of the wafer from FIG. 1 subsequent to the dissolution of the protective layer 15 and during rotation about the axis 24 in a spin dryer after de-ionized water rinsing. The liquid pockets 18 cannot be flung free and remain after the spin dry step whereupon the liquid evaporates, concentrating the ions 22, and eventually resulting in precipitation to form a watermark. Likewise, liquid droplets 20 remain on surface edges after spinning is stopped. Deep topographic features such as 16, which happen to face the rotational axis 24 will also retain residual liquid and result in residue precipitation.

A method using $NH_4OH/H_2O_2$ or $HCL/H_2O_2$ solutions, commonly called RCA cleaning, which does not result in the formation of fluorosilicate anionic species is illustrated by FIG. 4. A discussion of the RCA technique may be found in Wolf, S. and Tauber, R. N., "Silicon Processing for the VLSI Era", Vol. 1, Lattice Press, Sunset Beach, Calif., (1986), p516ff. These cleaning solutions 40 are not as effective at removing the sidewall polymer as the HF based solutions. Subsequent rinse/spin-dry operations 42 leave aqueous pockets in the high aspect ratio trenches and in deep corners of the wafer topography. Evaporation, concentrates the polymer residues in these regions which eventually precipitate, leaving watermarks on the wafer surface.

As is to be anticipated, the severity of the problem increases as the aspect ratio of the trench increases. The watermark residues have deleterious effects on the operating characteristics of the devices wherein they are present. Not only are the electrical characteristics below standard and non-uniform, but also the reliability of the devices is placed at risk.

Fukazawa, U.S. Pat. No. 5,470,393 describes a method for cleaning silicon wafers wherein a sequence of HF—HCl/ $H_2O_2$— water occurs. The procedure is accomplished in a single etchant tank. The components pass through the tank in a continuous flow with varying concentrations. The components are added to and removed from the flow in a programmed sequence such that during one period all three (HF, $H_2O_2$, and HCl) are present in the tank. The programmed sequence is designed to repress the formation of native oxide which inhibits the removal of copper, and does not address the removal of silicateous and polymeric residues.

Chen U.S. Pat. No. 5,308,400 describes a technique for removing particulates from silicon wafers in process which uses a room temperature HF—$NH_4OH/H_2O_2$—$H_2O$ cleaning sequence with vigorous agitation by nitrogen bubbling and spraying.

SUMMARY OF THE INVENTION

It is an object of this invention to provide a cleaning method for silicon wafers having high aspect ratio topographic features. In particular, such cleaning procedures are to be capable of thoroughly and reliably removing ionic and polymeric residues following reactive-ion-etching procedures.

It is a further object of this invention to prevent the formation of watermarks on silicon wafers caused by precipitated residues following aqueous cleaning procedures.

These objects are accomplished by subjecting the silicon wafers to a sequence of treatments wherein the first is in an HF based solution containing a surfactant and the second is in an ammoniacal/$H_2O_2$ or HCl/$H_2O_2$ based solution. The wafers are rinsed in de-ionized water between the first and second treatments and are rinsed and dried after the second treatment.

The HF based solution removes the polymeric protective layer and any oxide residues. The second ammoniacal or HCl based solution draws strongly chemisorbed fluorosilicate ionic species from the silicon surfaces into solution and permits them to be rinsed away. Residual water pockets remaining in the deep trenches are thus left free of dissolved materials and do not leave watermarks when the liquid evaporates. Key to the procedure is the presence of a surfactant in the HF solution and the avoidance of drying during transfer steps within the cleaning sequence. A spin-dry procedure or a solvent rinse is applied only after the final de-ionized water rinse.

BRIEF DESCRIPTION OF THE DRAWINGS

FIG. 1 is a cross section of a silicon wafer after deep high aspect ratio trenches have been etched into its surface.

FIG. 2 is a flow chart of a cleaning procedure which leads to the formation of watermarks in deep trenches.

DESCRIPTION OF THE PREFERRED EMBODIMENTS

Accordingly, a p-type <100> oriented single-crystalline silicon wafer is provided. Deep trench field isolation regions are to be incorporated adjacent to devices which may already be partially formed within the silicon surface. For example bipolar transistors where a blanket collector region and an epitaxial layer is present on the wafer. The deep trenches not only contain the device isolation but also define the collectors as well.

Referring to FIG. 1, an RIE etch mask 12 is formed over the wafer 10 surface to expose regions where the trenches are to be formed. The mask structure and thickness depends upon the chemistry and conditions of the RIE to be used. In this embodiment there is used a mask comprising a pad layer of 100 to 200 Angstroms of silicon oxide, thermally grown over the silicon surface, and a layer between about 1,300 and 2,500 Angstroms of silicon nitride, deposited over the pad layer by chemical-vapor-deposition(CVD). This composite oxide/nitride layer is patterned with photoresist and etched by well known procedures to form a mask which will withstand the silicon RIE.

The trench RIE operation next performed after the removal of the photoresist patterning mask. The etchant chemistry is typically chlorine based where the chlorine is provided either as $Cl_2$ or in compound form. Following the RIE, the profile shown in FIG. 1 is obtained. Further processing now requires the thorough removal of the protective layer 15 and the removal of any other species which may be formed during this removal.

Figure 3:
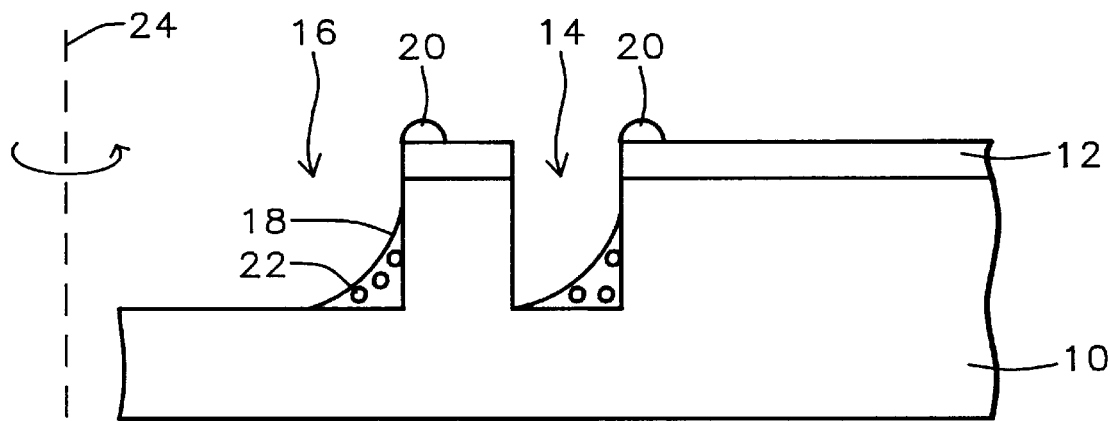
FIG. 3 cross section of a wafer during rotation about an axis in a spin dryer.
Figure 4:
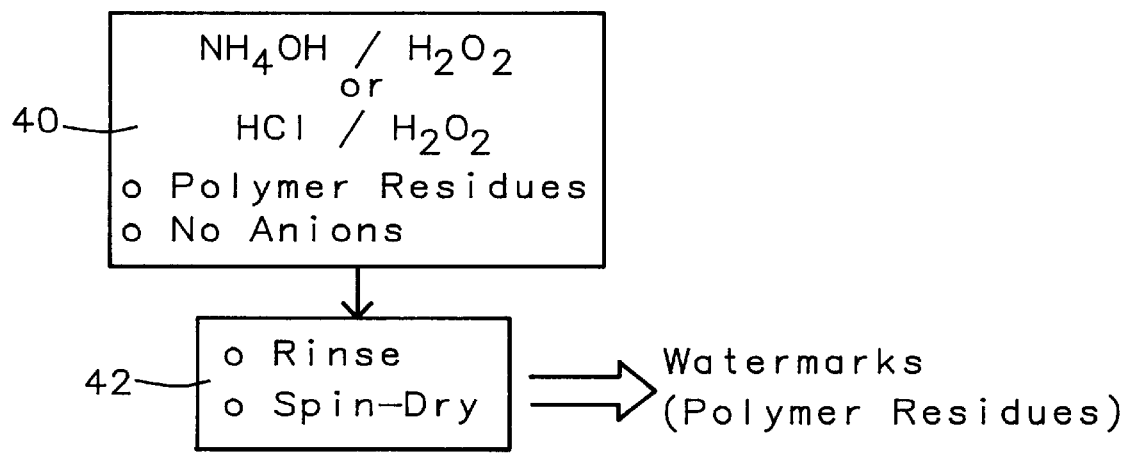
FIG. 4 is a flow chart of another cleaning procedure which leads to the formation of watermarks in deep trenches.
Figure 5:
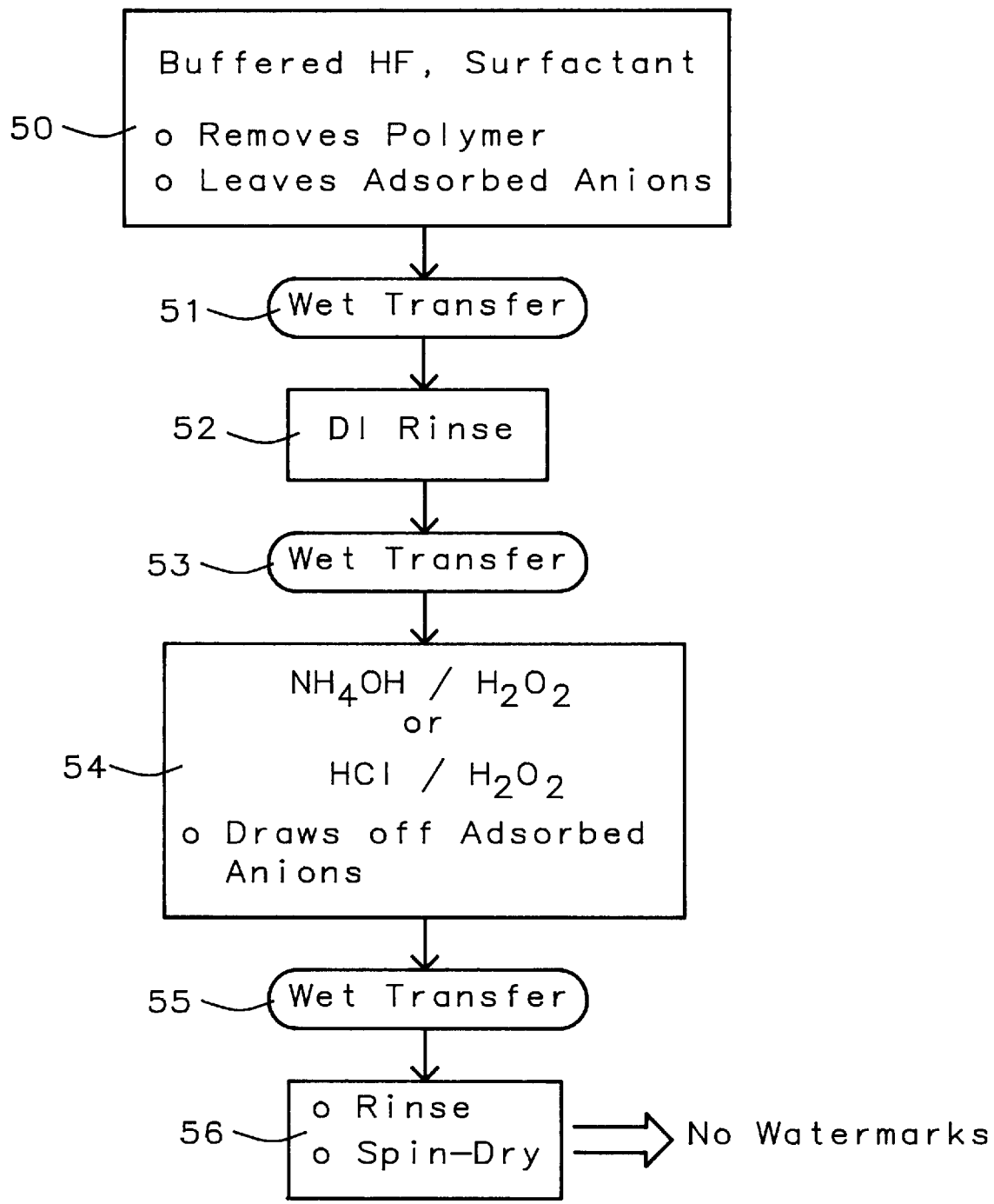
FIG. 5 is a flow chart of a cleaning procedure taught by this invention which does not lead to the formation of watermarks in deep trenches.

In FIG. 5 there is given a flow chart showing the sequence of cleaning steps taught by this invention. In the first step 50 the wafer, in a multi-wafer carrier, is dipped in a buffered HF solution having the composition of 1 part by volume of 40 wt %(12.75 molar) $NH_4F$ and 1 part by volume of 49 wt %(28.3 molar) HF to which is added 50 parts by volume of de-ionized water and a surfactant to reduce surface tension.

The buffered HF solution quickly dispatches the protective layer along the trench sidewalls and the surfactant in the etch lowers the surface tension of the wafer thereby reducing the adsorption of anions. After a period of about 10 to 25 seconds, the wafer is removed and while still wet 51, quickly immersed 52 in a flowing de-ionized water rinse tank for 5 to 10 seconds and then transferred, again being careful to avoid drying 53, into a second solution 54 containing 0.4 parts by volume of 29 wt %(7.4 molar) $NH_4OH$, 1 part by volume 30 wt % $H_2O_2$, and 5 parts by volume of $H_2O$. This solution is heated to about 70° C. and receives ultrasonic agitation. The function of the second solution, is to draw off adsorbed anions from the wafer surface.

After an immersion for a period of about 180 to 300 seconds, the wafer is removed from the second solution and, while still wet 55, is quickly transferred to a rinse bath 56 containing flowing de-ionized water and allowed to rinse for approximately 5 minutes. The wafer is then transferred to a second rinse bath for an additional 5 minute immersion.

The wafer is then dipped into isopropyl alcohol for about 1 minute to remove residual water, drained, and allowed to dry. As an alternative to the isopropyl alcohol dip, the wafer may be spun dry after the final de-ionized water rinse. The isopropyl alcohol dip is preferred.

The first embodiment uses a $NH_4OH/H_2O_2$ solution to remove residual fluoro-silicate anionic species. Alternately, in a second embodiment the procedure of the first embodiment is followed but with the replacement of the ammoniacal second solution by an acidic solution containing 1 part by volume 36%(11.6 molar) HCl and 1 part by volume 31% $H_2O_2$. This solution is heated to about 60° C. and receives ultrasonic agitation. The acidic solution also functions effectively at drawing away adsorbed anions from the silicon surface.

Figure 6:
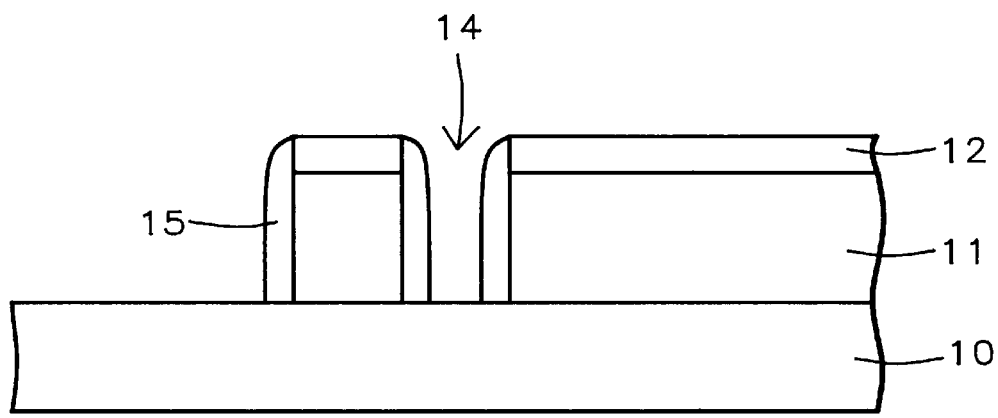
FIG. 6 is a cross section of a silicon wafer having high aspect ratio trenches formed in layers deposited over its surface wherein the trenches have exposed silicon at their base.

The first and second embodiments of the cleaning method taught by this invention deal with trenches etched into the silicon and therefore have silicon walls as well as silicon bases. In a third embodiment the cleaning process, as taught by the first and second embodiments, is applied to trenches having silicon bases and walls which may consist of other materials such as silicon oxide, silicate glasses, silicon nitride, or polysilicon or a combination of these materials. Such situations are encountered when, for example, contact openings are formed by RIE through sundry deposited layers on the silicon wafer. Bit line contacts to DRAM devices may require deep openings through thick insulator layers. These openings, tend to be very narrow because of precious lateral space in high density DRAM circuits and therefore present high aspect ratios. FIG. 6 shows a cross section of such a trench or contact opening. The layer 11 represents a thick insulator layer over the wafer 10. The layer 12 is the patterning mask used to form the trench 14. The polymer film 15 formed during the RIE is removed by the method used in the first and second embodiments.

The embodiments described use a p-type silicon wafer. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

While the invention has been particularly shown and described with reference to the preferred embodiments thereof, it will be understood by those skilled in the art that various changes in form and details may be made without departing from the spirit and scope of the invention.

What is claimed is:

1. A method for removal of adsorbed ionic species from silicon pockets in a silicon wafer after reactive ion etching comprising:

(a) providing a silicon wafer having freshly etched silicon pockets;

(b) performing a first step of treating said silicon wafer with a first solution containing hydrofluoric acid and a surfactant;

(c) performing a second step, sequentially from said first step, of removing said silicon wafer from said first solution and, with dispatch and while still wet, rinsing said silicon wafer with de-ionized water;

(d) performing a third step, sequentially from said second step, of transferring and immersing said silicon wafer while still wet, and with dispatch, into a second solution containing hydrogen peroxide and ammonium hydroxide, whereby adsorbed ionic species are drawn out from said pockets;

(e) performing a fourth step, sequentially from said third step, of transferring said silicon wafer while still wet to a rinse bath and, rinsing said silicon wafer with de-ionized water; and (f) performing a fifth step, sequentially from said fourth step, of drying said silicon wafer.

2. The method of claim 1 wherein said first solution is prepared by diluting one volume of 49 weight % or thereabout hydrofluoric acid with between about 5 and 10 volumes of de-ionized water and adding said surfactant.

3. The method of claim 1 wherein said first solution is prepared by diluting about one volume of 49% or thereabout by weight hydrofluoric acid and about one volume of 40% or thereabout by weight $NH_4F$ solution with about 50 volumes of de-ionized water and adding said surfactant.

4. The method of claim 1 wherein said second solution is prepared by combining about 0.4 volumes of 28% or thereabout by weight $NH_4OH$ with about 1 volume of a 31% or thereabout by weight $H_2O_2$ solution and about 5 volumes of de-ionized water.

5. The method of claim 1 wherein said second solution is prepared by combining about 1 volume of 36% or thereabout by weight HCl with about 1 volume of a 31% or thereabout by weight $H_2O_2$ solution and about 5 volumes of de-ionized water.

6. The method of claim 1 wherein ultrasonic agitation is applied to said first solution, said second solution, and to said de-ionized water during said processing.

7. A method for removal of adsorbed ionic species from within freshly reactive ion etched silicon trenches with aspect ratios greater than one comprising:

(a) providing a silicon wafer having reactive ion etched silicon trenches with aspect ratios greater than one;

(b) a first step of treating said silicon wafer with a first solution containing hydrofluoric acid and a surfactant;

(c) a second step, sequentially from said first step of removing said silicon wafer from said first solution and with dispatch and while still wet, rinsing said silicon wafer with de-ionized water;

(d) a third step, sequentially from said second step, of transferring and immersing said silicon wafer while still wet, and with dispatch, into a second solution containing hydrogen peroxide and ammonium hydroxide whereby adsorbed ionic species are drawn out from said trenches;

(e) a fourth step, sequentially from said third step, of transferring said silicon wafer while still wet to a rinse bath and, rinsing said silicon wafer with de-ionized water; and (f) a fifth step, sequentially from said fourth step, of drying said silicon wafer.

8. The method of claim 7 wherein said first solution is prepared by diluting one volume of 49 weight % or thereabout hydrofluoric acid with between about 5 and 10 volumes of de-ionized water and adding said surfactant.

9. The method of claim 7 wherein said first solution is prepared by diluting about one volume of 49% or thereabout by weight hydrofluoric acid and one volume of 40% or thereabout by weight $NH_4F$ solution with about 50 volumes of de-ionized water and adding said surfactant.

10. The method of claim 7 wherein said second solution is prepared by combining about 0.4 volumes of 28% or thereabout by weight $NH_4OH$ with about 1 volume of a 31% or thereabout by weight $H_2O_2$ solution and about 5 volumes of de-ionized water.

11. The method of claim 7 wherein said second solution is prepared by combining about 1 volume of 36% or thereabout by weight HCl with about 1 volume of a 31% or thereabout by weight $H_2O_2$ solution and about 5 volumes of de-ionized water.

12. The method of claim 7 wherein ultrasonic agitation is applied to said first solution, said second solution, and to said de-ionized water during said processing.

* * * * *